United States Patent
Nakaoka et al.

(10) Patent No.: US 10,164,571 B2
(45) Date of Patent: Dec. 25, 2018

(54) CRYSTAL OSCILLATOR AND METHOD OF MANUFACTURING CRYSTAL OSCILLATORS

(71) Applicant: NIHON DEMPA KOGYO CO., LTD., Tokyo (JP)

(72) Inventors: Takashi Nakaoka, Saitama (JP); Kazuo Akaike, Saitama (JP); Hiroshi Hoshigami, Saitama (JP); Kaoru Kobayashi, Hokkaido (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 78 days.

(21) Appl. No.: 15/209,762

(22) Filed: Jul. 14, 2016

(65) Prior Publication Data

US 2016/0322936 A1 Nov. 3, 2016

Related U.S. Application Data

(63) Continuation of application No. PCT/JP2015/056210, filed on Mar. 3, 2015.

(30) Foreign Application Priority Data

| Mar. 7, 2014 | (JP) | ............................... | 2014-044712 |
| Mar. 7, 2014 | (JP) | ............................... | 2014-044713 |

(Continued)

(51) Int. Cl.
*H03B 5/32* (2006.01)
*H03L 1/02* (2006.01)
(Continued)

(52) U.S. Cl.
CPC .............. *H03B 5/32* (2013.01); *H03B 5/366* (2013.01); *H03H 9/24* (2013.01); *H03L 1/02* (2013.01); *H03B 2201/0208* (2013.01)

(58) Field of Classification Search
CPC .. H03H 9/24; H03B 5/362; H03B 2201/0208; H03B 5/366; H03L 1/02
(Continued)

(56) References Cited

U.S. PATENT DOCUMENTS

| 4,079,280 A | 3/1978 | Kusters et al. |
| 7,986,194 B2 * | 7/2011 | Kiyohara ................. H03B 5/36 331/116 FE |

(Continued)

FOREIGN PATENT DOCUMENTS

| CN | 1801600 | 7/2006 |
| CN | 102111107 | 6/2011 |

(Continued)

OTHER PUBLICATIONS

Vittoz et al, High-Performance crystal oscillator circuits: Theory and application, IEEE Journal of Solid State Circuits, vol. 23, Jun. 1988, pp. 774-783.*

"Office Action of China Counterpart Application," dated May 29, 2018, with English translation thereof, pp. 1-17.

*Primary Examiner* — Arnold Kinkead
(74) *Attorney, Agent, or Firm* — JCIPRNET

(57) ABSTRACT

An crystal resonator includes a first oscillating circuit that oscillates a crystal resonator at a first frequency, a first impedance adjusting circuit that adjusts an impedance of a first oscillating system including the crystal resonator and the first oscillating circuit, a second oscillating circuit that oscillates the crystal resonator at a second frequency that is different from the first frequency, a second impedance adjusting circuit that adjusts an impedance of a second oscillating system including the crystal resonator and the second oscillating circuit, and a controlling circuit that controls the first impedance adjusting circuit and the second impedance adjusting circuit.

18 Claims, 11 Drawing Sheets

(30) Foreign Application Priority Data

Jul. 31, 2014 (JP) ................................. 2014-156876
Jul. 31, 2014 (JP) ................................. 2014-156877

(51) Int. Cl.
*H03H 9/24* (2006.01)
*H03B 5/36* (2006.01)

(58) Field of Classification Search
USPC .................. 331/116 FE, 116 R, 158, 46, 176
See application file for complete search history.

(56) References Cited

U.S. PATENT DOCUMENTS

| | | |
|---|---|---|
| 2006/0176120 A1 | 8/2006 | Satoh |
| 2008/0180183 A1 | 7/2008 | Kiyohara et al. |
| 2011/0156823 A1 | 6/2011 | Koyama et al. |
| 2011/0204983 A1 | 8/2011 | Akaike et al. |
| 2015/0116051 A1* | 4/2015 | Terrovitis ............... H03B 5/362 331/158 |

FOREIGN PATENT DOCUMENTS

| | | |
|---|---|---|
| CN | 102163953 | 8/2011 |
| EP | 2106028 | 9/2009 |
| EP | 2011-135342 | 7/2011 |
| JP | S52-147481 | 12/1977 |
| JP | H10-065449 | 3/1998 |
| JP | 2006-189312 | 7/2006 |
| JP | 2007-103985 | 4/2007 |
| JP | 2010-161437 | 7/2010 |
| JP | 2011-135342 | 7/2011 |
| JP | 2011-176393 | 9/2011 |
| JP | 2014-007678 | 1/2014 |

* cited by examiner

CRYSTAL OSCILLATOR AND METHOD OF MANUFACTURING CRYSTAL OSCILLATORS

CROSS-REFERENCE TO RELATED APPLICATIONS

The present application is a continuation application of International Application number PCT/JP2015/056210, filed on Mar. 3, 2015, which claims priority under 35 U.S.C. § 119(a) to Japanese Patent Application No. 2014-044712, filed on Mar. 7, 2014, Japanese Patent Application No. 2014-044713, filed on Mar. 7, 2014, Japanese Patent Application No. 2014-156876, filed on Jul. 31, 2014, and Japanese Patent Application No. 2014-156877, filed on Jul. 31, 2014. The content of this application is incorporated herein by reference in their entirety.

BACKGROUND OF THE INVENTION

Field of the Invention

The present invention relates to crystal oscillators and a method of manufacturing the crystal oscillators.

Description Related to the Prior Art

Conventionally, a crystal oscillator that includes a plurality of crystal resonators and is capable of outputting an oscillation signal at a first frequency and an oscillation signal at a second frequency that is different from the first frequency is known. For example, a temperature-compensated crystal oscillator that can output a first oscillation signal to be outputted to an exterior apparatus and a second oscillation signal that is used for a temperature sensor is disclosed in Japanese Unexamined Patent Application Publication No. 2011-135342.

FIG. 12 shows a configuration of a conventional crystal oscillator 100 that outputs signals of two frequencies. As shown in FIG. 12, the conventional crystal oscillator 100 includes a first crystal resonator 101, a first oscillating circuit 102 that oscillates the first crystal resonator 101 at a first frequency, a second crystal resonator 103, and a second oscillating circuit 104 that oscillates the second crystal resonator 103 at a second frequency.

However, since the conventional crystal oscillator 100 includes two crystal resonators, there is a problem that its mounting area is large.

In order to deal with this problem, there is a method that oscillates a crystal resonator at different frequencies at the same time. FIG. 13 shows a configuration of the crystal oscillator 110 that oscillates a crystal resonator at different frequencies at the same time. The crystal oscillator 110 includes a crystal resonator 111, a first oscillating circuit 112 that oscillates the crystal resonator 111 at a first frequency and a second oscillating circuit 113 that oscillates the crystal resonator 111 at a second frequency. However, the crystal oscillator 110 has a problem that each of the oscillating circuits thereof being mutually affected and cannot stably oscillate an output signal.

SUMMARY OF THE INVENTION

The present invention is created in view of the aforementioned circumstances and is to provide a crystal oscillator and a method of manufacturing crystal oscillators capable of stably oscillating an output signal and making its mounting area smaller.

A crystal oscillator of the present invention is characterized by comprising: a first oscillating circuit that oscillates a crystal resonator at a first frequency, a first impedance adjusting circuit that adjusts an impedance of a first oscillating system including the crystal resonator and the first oscillating circuit, a second oscillating circuit that oscillates the crystal resonator at a second frequency that is different from the first frequency, a second impedance adjusting circuit that adjusts an impedance of a second oscillating system including the crystal resonator and the second oscillating circuit, and a controlling circuit that controls the first impedance adjusting circuit and the second impedance adjusting circuit.

A method of manufacturing a crystal oscillator of the present invention comprises: preparing a crystal oscillator that includes a first oscillating circuit that oscillates a crystal resonator at a first frequency, a first impedance adjusting circuit that adjusts an impedance of a first oscillating system including the crystal resonator and the first oscillating circuit, a second oscillating circuit that oscillates the crystal resonator at a second frequency that is different from the first frequency, a second impedance adjusting circuit that adjusts an impedance of a second oscillating system including the crystal resonator and the second oscillating circuit, and a controlling circuit that controls the first impedance adjusting circuit and the second impedance adjusting circuit; adjusting an impedance of the first oscillating system by adjusting the first impedance adjusting circuit; and adjusting an impedance of the second oscillating system by adjusting the second impedance adjusting circuit.

Further, adjusting the impedance of the first oscillating system may include: adjusting a current value through the first impedance adjusting circuit by controlling a resistance array of the first impedance adjusting circuit, and adjusting frequency characteristics of the first impedance adjusting circuit by controlling a condenser array of the first impedance adjusting circuit; and adjusting the impedance of the second oscillating system may include: adjusting a current value through the second impedance adjusting circuit by controlling a resistance array of the second impedance adjusting circuit, and adjusting frequency characteristics of the second impedance adjusting circuit by controlling a condenser array of the second impedance adjusting circuit.

DETAILED DESCRIPTION OF THE INVENTION

Hereinafter, the present invention is described though the exemplary embodiment of the invention but the undermentioned embodiment does not limit the invention according to the claims and all of the combinations of characteristics described in the embodiment are not necessarily essential for a solution of the invention.

The First Exemplary Embodiment

[Configuration of Crystal Oscillator 1]

Figure 1:
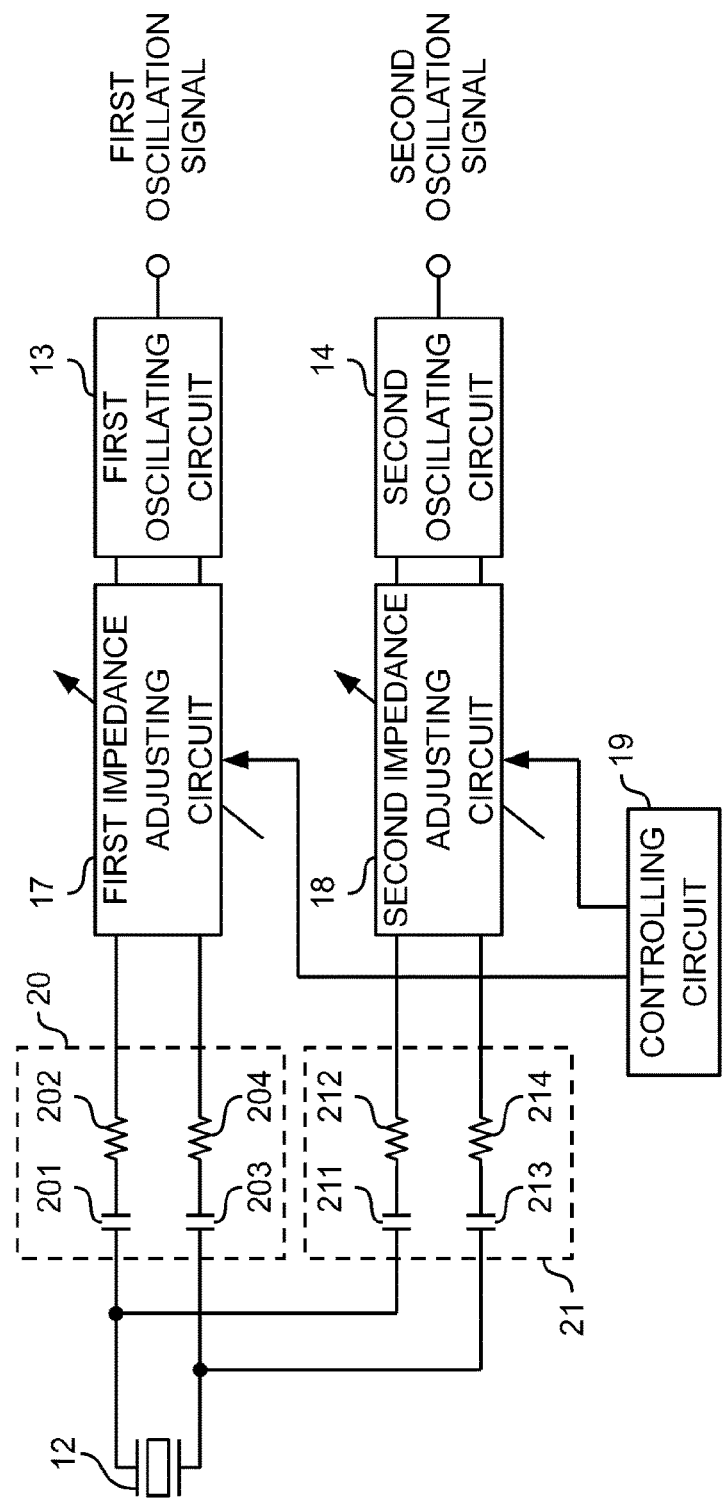
FIG. 1 shows a circuit configuration diagram of a crystal oscillator according to the first exemplary embodiment.

FIG. 1 shows a circuit configuration diagram of a crystal oscillator 1 according to the first exemplary embodiment. The crystal oscillator 1 includes a crystal resonator 12, a first oscillating circuit 13, a second oscillating circuit 14, a first impedance adjusting circuit 17, a second impedance adjusting circuit 18, a controlling circuit 19, a first isolation adjusting circuit 20, and a second isolation adjusting circuit 21.

The crystal resonator 12 is, for example, an AT-cut crystal resonator or an SC-cut crystal resonator.

The first oscillating circuit 13 is connected to the crystal resonator 12 and generates a first oscillation signal by oscillating the crystal resonator 12 at a first frequency.

The second oscillating circuit 14 is connected to the crystal resonator 12 and generates a second oscillation signal by oscillating the crystal resonator 12 at a second frequency that is different from the first frequency.

Here, a circuit that includes the crystal resonator 12 and the first oscillating circuit 13 and that generates the first oscillation signal is referred to as a first oscillating system, and a circuit that includes the crystal resonator 12 and the second oscillating circuit 14 and that generates the second oscillation signal is referred to as a second oscillating system.

If the crystal resonator 12 is an AT-cut crystal resonator, the first frequency is a frequency when the crystal resonator 12 is oscillated at a first order, and the second frequency is a frequency when the crystal resonator 12 is oscillated at a second order that is different from the first order. Here, the first order and the second order are overtone orders of the crystal resonator 12 but any of the first frequency and the second frequency may be the fundamental frequency.

Further, if the crystal resonator 12 is an SC-cut crystal resonator, the first frequency is a frequency at the time when the crystal resonator 12 is oscillated at a first mode (for example, the B-mode), and the second frequency is a frequency at the time when the crystal resonator 12 is oscillated at a second mode (for example, the C-mode).

The first impedance adjusting circuit 17 is provided between the crystal resonator 12 and the first oscillating circuit 13, and adjusts an impedance of the first oscillating system.

The second impedance adjusting circuit 18 is provided between the crystal resonator 12 and the second oscillating circuit 14, and adjusts an impedance of the second oscillating system.

The first impedance adjusting circuit 17 and the second impedance adjusting circuit 18 include a resistance array that consists of a plurality of resistances and a condenser array that consists of a plurality of condensers.

The controlling circuit 19 is connected to the first impedance adjusting circuit 17 and the second impedance adjusting circuit 18, and controls the first impedance adjusting circuit 17 and the second impedance adjusting circuit 18. The controlling circuit 19 conducts a first step for adjusting an impedance of the first oscillating system by adjusting the first impedance adjusting circuit 17 and conducts a second step for adjusting the impedance of the second oscillating system by adjusting the second impedance adjusting circuit 18 when the crystal oscillator 1 is manufactured.

Specifically, the controlling circuit 19 conducts a step for adjusting a current value through the first impedance adjusting circuit 17 by controlling the resistance array of the first impedance adjusting circuit 17 as a control according to the first step, and conducts a step for adjusting the frequency characteristics of the first impedance adjusting circuit 17 by controlling the condenser array of the first impedance adjusting circuit 17.

Further, the controlling circuit 19 conducts a step for adjusting the current value through the second impedance adjusting circuit 18 by controlling the resistance array of the second impedance circuit 18 as a control according to the second step and conducts a step for adjusting the frequency characteristics of the second impedance adjusting circuit 18 by controlling the condenser array of the second impedance adjusting circuit 18.

Hereinafter, a specific controlling method conducted by the controlling circuit 19 is described with an example in which the controlling circuit 19 controls the first impedance adjusting circuit 17. Further, a description of an example in which the controlling circuit 19 controls the second impedance adjusting circuit 18 is omitted since the controlling circuit 19 controls the second impedance adjusting circuit 18 in the same controlling method as that of the controlling circuit 19 when it controls the first impedance adjusting circuit 17.

First, the controlling circuit 19 changes a resistance value in the first impedance adjusting circuit 17 to change the negative resistance characteristics of the first oscillating system by fixing the capacitance value in the first impedance adjusting circuit 17 and by controlling the resistance array. Specifically, the controlling circuit 19 includes a register that stores a table in which the resistance value of the resistance array of the first impedance adjusting circuit 17 and a current through the first impedance adjusting circuit 17 are associated with each other. Further, the controlling circuit 19 changes over the current value through the first impedance adjusting circuit 17 by conducting a step changeover of the resistance value of the resistance array on the basis of the table. Furthermore, the controlling circuit 19 adjusts the negative resistance characteristics so that a signal at the first frequency is oscillated in the first oscillating system.

Figure 2:
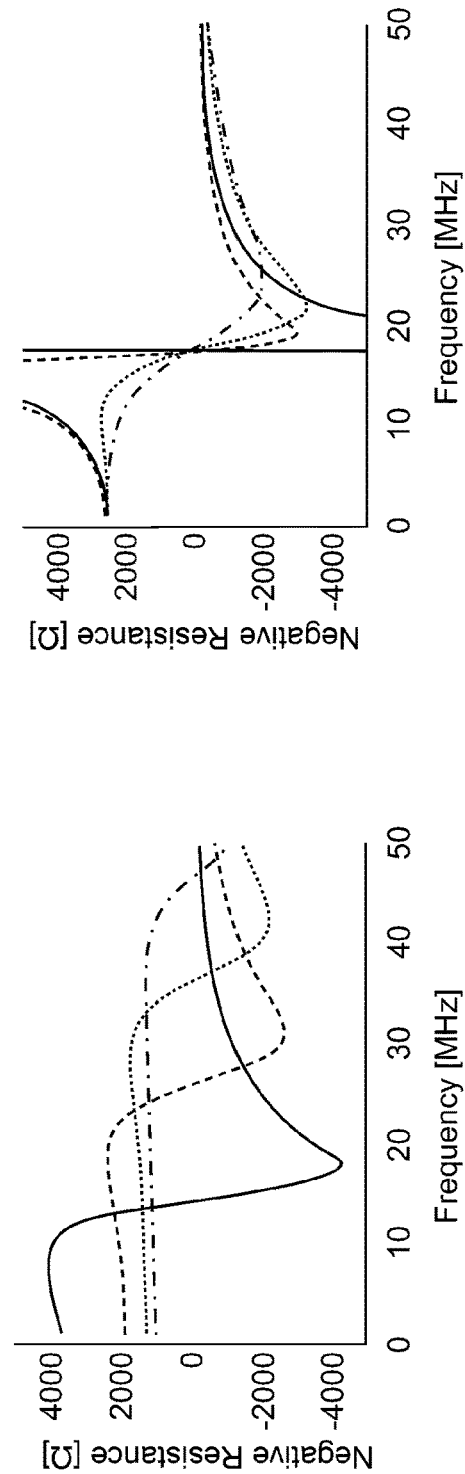
FIG. 2A shows the negative resistance characteristics when the capacitance value in a first impedance adjusting circuit according to the first exemplary embodiment is fixed and the resistance value thereof is changed.
FIG. 2B shows the negative resistance characteristics when the resistance value in the first impedance adjusting circuit according to the first exemplary embodiment is fixed and the capacitance value thereof is changed.

FIG. 2A shows the negative resistance characteristics when the capacitance value in the first impedance adjusting circuit 17 according to the first exemplary embodiment is fixed and the resistance value thereof is changed. In FIG. 2A, the characteristics shown with a solid line is the negative resistance characteristics when the resistance value of the first impedance adjusting circuit 17 is a first resistance value, the characteristics shown with a dashed line is the negative resistance characteristics when the resistance value of the first impedance adjusting circuit 17 is a second resistance value, the characteristics shown with a dotted line is the negative resistance characteristics when the resistance value of the first impedance adjusting circuit 17 is a third resistance value, and the characteristics shown with an alternate long and short dash line is the negative resistance characteristics when the resistance value of the first impedance adjusting circuit 17 is a fourth resistance value. As shown in FIG. 2A, it can be seen that the frequency in which the negative resistance becomes a minus value changes by changing the resistance value.

For example, when the first frequency of the first oscillation signal outputted from the first oscillating circuit 13 is about 20 MHz, the controlling circuit 19 specifies a combination of resistances that correspond to the first resistance value in which a value of the negative resistance at 20 MHz shows the minus value. In this manner, the controlling circuit 19 can adjust the negative resistance at around the first frequency to be the minus value.

Subsequently, the controlling circuit 19 changes the capacitance value in the first impedance adjusting circuit 17 to change the frequency characteristics of the negative resistance by fixing the resistance array with the specified combination of the resistances and by controlling the condenser array. Specifically, the controlling circuit 19 stores the table in which the capacitance value of the condenser array of the first impedance adjusting circuit 17 and the current through the first impedance adjusting circuit 17 are associated with each other in the register. Then, the controlling circuit 19 changes over the capacitance value of the first impedance adjusting circuit 17 by conducting a step changeover of the capacitance value of the condenser array on the basis of the table. Hence, the controlling circuit 19 adjusts a depth of the negative resistance of the first oscillating system at around the first frequency.

FIG. 2B shows the negative resistance characteristics when the resistance value in the first impedance adjusting circuit 17 according to the first exemplary embodiment is fixed and the capacitance value thereof is changed. In FIG. 2B, the characteristics shown with a solid line is the negative resistance characteristics when the capacitance value of the first impedance adjusting circuit 17 is a first capacitance value, the characteristics shown with a dashed line is the negative resistance characteristics when the capacitance value of the first impedance adjusting circuit 17 is a second capacitance value, the characteristics shown with a dotted line is the negative resistance characteristics when the capacitance value of the first impedance adjusting circuit 17 is a third capacitance value, and the characteristics shown with an alternate long and short dash line is the negative resistance characteristics when the capacitance value of the first impedance adjusting circuit 17 is a fourth capacitance value. As shown in FIG. 2B, it can be seen that the value of the negative resistance changes but the frequency in which the negative resistance becomes a minus value does not almost change by changing the capacitance value. In FIG. 2B, it can be seen that a magnitude of the negative resistance at around 20 MHz significantly changes by changing the capacitance value.

For example, when the first frequency of the first oscillation signal outputted from the first oscillating circuit 13 is about 20 MHz, the controlling circuit 19 specifies a combination of condensers that correspond to the second capacitance value so that the negative resistance does not suddenly change even if the frequency at 20 MHz changes. In this manner, the controlling circuit 19 can adjust the negative resistance at around the first frequency not to be significantly changed. Further, the controlling circuit 19 specifies a plurality of combinations of capacitance that stably oscillate at the first frequency by controlling the condenser array and may choose a combination from the specified combinations of the capacitance.

It was explained that the first impedance adjusting circuit 17 and the second impedance adjusting circuit 18 are provided with the condenser array, but it is not necessarily so limited and they may include a variable capacitance diode. In this case, the controlling circuit 19 adjusts at least any impedance of the first impedance adjusting circuit 17 and the second impedance adjusting circuit 18 by controlling the variable capacitance diode.

The first isolation adjusting circuit 20 is provided between the crystal resonator 12 and the first impedance adjusting circuit 17 and secures an isolation between oscillating circuits.

Specifically, the first isolation adjusting circuit 20 includes a condenser 201, a resistance 202, a condenser 203, and a resistance 204. The condenser 201 and the resistance 202 are connected in series and are connected to one end of the crystal resonator 12 and one end of the first impedance adjusting circuit 17. The condenser 203 and the resistance 204 are connected in series and are connected to the other end of the crystal resonator 12 and the other end of the first impedance adjusting circuit 17.

The second isolation adjusting circuit 21 is provided between the crystal resonator 12 and the second impedance adjusting circuit 18 and secures an isolation between oscillating circuits.

Specifically, the second isolation adjusting circuit 21 includes a condenser 211, a resistance 212, a condenser 213, and a resistance 214. The condenser 211 and the resistance 212 are connected in series and are connected to a node between one end of the crystal resonator 12 and the condenser 201, and one end of the second impedance adjusting circuit 18. The condenser 213 and the resistance 214 are connected in series and are connected to a node between other end of the crystal resonator 12 and the condenser 203, and the other end of the second impedance adjusting circuit 18.

Here, the capacitance value and the resistance value of the first isolation adjusting circuit 20 and the second isolation adjusting circuit 21 are adjusted according to the use of the first oscillation signal and the second oscillation signal. For example, in the first exemplary embodiment, the isolation is secured by adjusting the capacitance value of the first isolation adjusting circuit 20 if the first oscillation signal is an oscillation signal to be outputted outside and if high stability is required for the first oscillation signal. In this case, the first isolation adjusting circuit 20 may not be provided with a resistance. Further, the isolation is secured by adjusting the resistance value of the second isolation adjusting circuit 21 if the second oscillation signal is an oscillation signal whose characteristics can be deteriorated.

Thus, by providing the first isolation adjusting circuit 20 and the second isolation adjusting circuit 21, each oscillating system is made to be less affected with the other oscillating system and can stably outputs an oscillation signal.

Effect of the First Exemplary Embodiment

As mentioned above, the crystal oscillator 1 according to the first exemplary embodiment includes the first impedance adjusting circuit 17 that adjusts the impedance of the first oscillating system, the second impedance adjusting circuit 18 that adjusts the impedance of the second oscillating system, and the controlling circuit 19 that controls the first impedance adjusting circuit 17 and the second impedance adjusting circuit 18. In this manner, the negative resistance in each oscillating system is adjusted to an appropriate value and a crystal resonator 12 is allowed to stably oscillate at two frequencies at the same time. Further, the mounting area can be reduced because the output signal is oscillated by a crystal resonator 12.

The Second Exemplary Embodiment

[Circuit Integration of the Oscillating Circuit, the Impedance Adjusting Circuit, and the Controlling Circuit]

Next, the second exemplary embodiment is described. The second exemplary embodiment is different from the first exemplary embodiment in a point that an oscillating circuit, an impedance adjusting circuit, and a controlling circuit are provided in an integrated circuit, and is the same as the first exemplary embodiment with respect to the other points.

Figure 3:
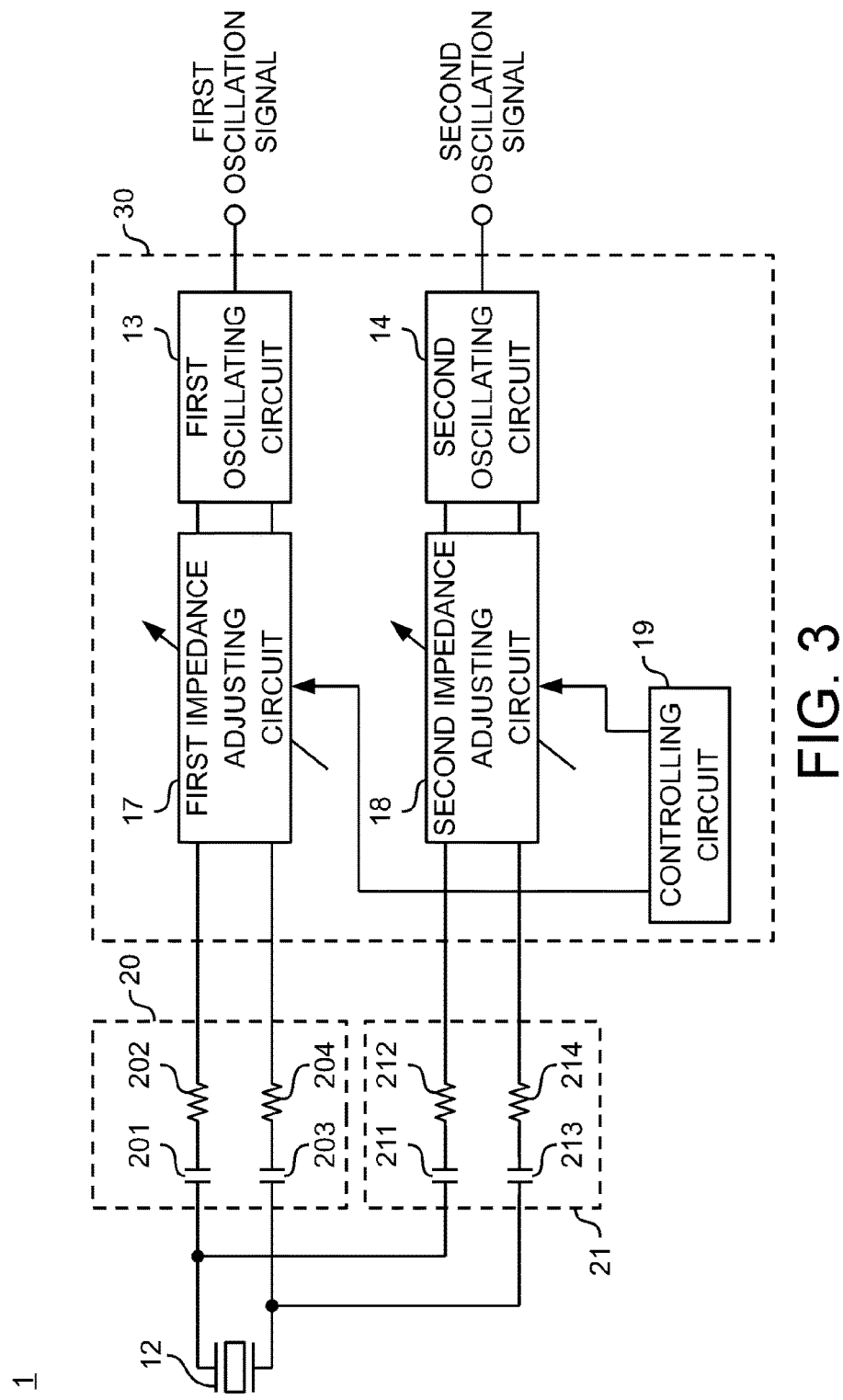
FIG. 3 shows a circuit configuration of a crystal oscillator according to the second exemplary embodiment.

FIG. 3 shows a circuit configuration of the crystal oscillator 1 according to the second exemplary embodiment. In the second exemplary embodiment, the crystal oscillator 1 further includes an integrated circuit 30. In the second exemplary embodiment, the first oscillating circuit 13, the second oscillating circuit 14, the first impedance adjusting circuit 17, the second impedance adjusting circuit 18, and the controlling circuit 19 are provided in the integrated circuit 30.

In this manner, the crystal oscillator 1 can achieve further minimization as compared to the first exemplary embodiment.

The Third Exemplary Embodiment

[Providing a Negative Resistance Generating Circuit]

Next, the third exemplary embodiment is described. The third exemplary embodiment is different from the first exemplary embodiment in a point that a negative resistance generating circuit is provided for each oscillating system, and is the same as the first exemplary embodiment with respect to the other points.

Figure 4:
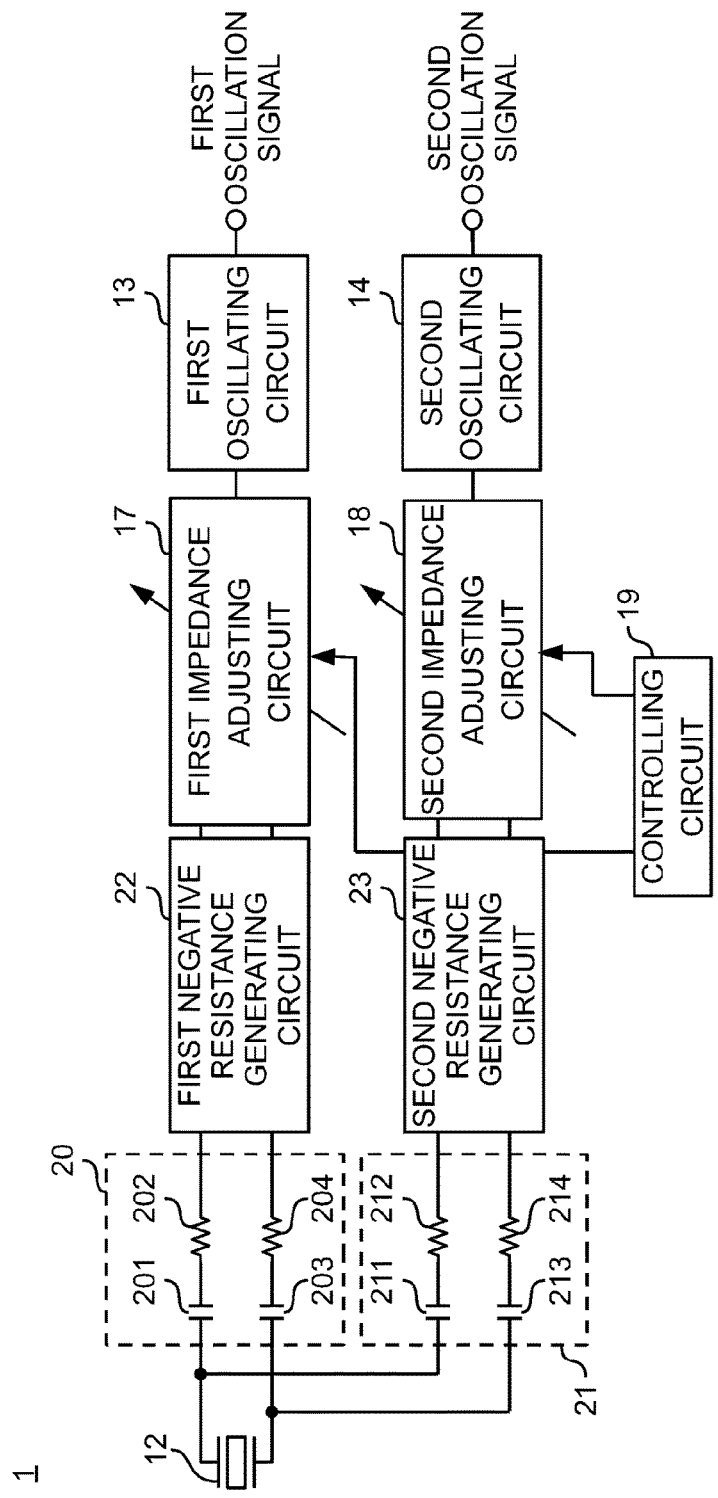
FIG. 4 shows a circuit configuration of a crystal oscillator according to the third exemplary embodiment.

FIG. 4 shows a circuit configuration of the crystal oscillator 1 according to the third exemplary embodiment. In the third exemplary embodiment, the crystal oscillator 1 further includes a first negative resistance generating circuit 22 and a second negative resistance generating circuit 23. Further, the crystal oscillator 1 may be provided with any of the first negative resistance generating circuit 22 and the second negative resistance generating circuit 23.

Furthermore, the crystal oscillator 1 may have the first oscillating circuit 13, the second oscillating circuit 14, the first impedance adjusting circuit 17, the second impedance adjusting circuit 18, and the controlling circuit 19 in an integrated circuit as the second exemplary embodiment does. Moreover, the crystal oscillator 1 may have the first negative resistance generating circuit 22 and the second negative resistance generating circuit 23 in an integrated circuit. In this manner, the mounting area can be further reduced.

The first negative resistance generating circuit 22 is provided between the crystal resonator 12 and the first oscillating circuit 13, and becomes high impedance at the first frequency and generates a negative resistance in the first oscillating system. Further, the first negative resistance generating circuit 22 becomes almost short-circuit state at frequencies out of a predetermined range with respect to the first frequency. Hence, a negative resistance does not almost exist at frequencies out of the predetermined range with respect to the first frequency in the first oscillating system.

The second negative resistance generating circuit 23 is provided between the crystal resonator 12 and the second oscillating circuit 14, and becomes high impedance at the second frequency and generates a negative resistance in the second oscillating system.

Furthermore, the second negative resistance generating circuit 23 becomes almost short-circuit state at frequencies out of a predetermined range with respect to the second frequency. Hence, a negative resistance does not almost exist at frequencies out of the predetermined range with respect to the second frequency in the second oscillating system.

Figure 5:
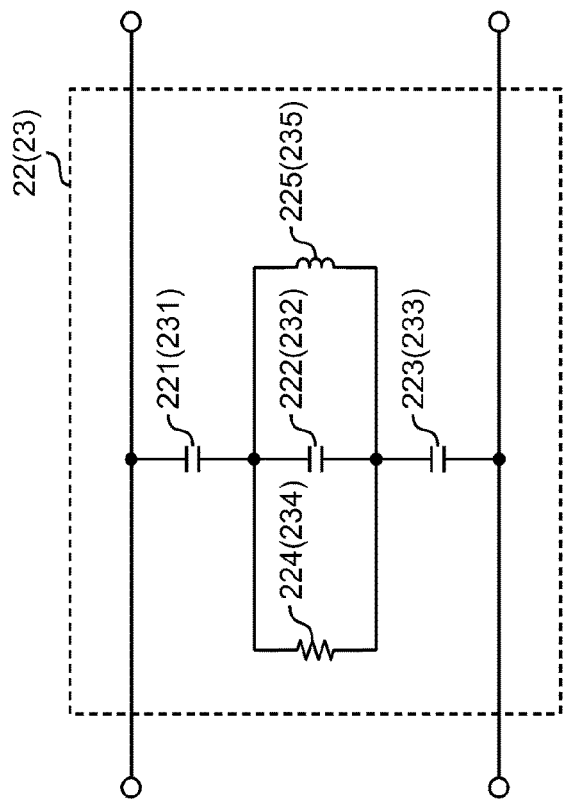
FIG. 5 shows an example of a circuit configuration of a first negative resistance generating circuit and a second negative resistance generating circuit according to the third exemplary embodiment.

FIG. 5 shows an example of a circuit configuration of the first negative resistance generating circuit 22 and the second negative resistance generating circuit 23 according to the third exemplary embodiment. The first negative resistance generating circuit 22 includes a condenser 221, a condenser 222, a condenser 223, a resistance 224, and an inductor 225. The condenser 221, the condenser 222, and the condenser 223 are connected in series and one end of them is connected between one end of the crystal resonator 12 and one end of the first impedance adjusting circuit 17, and the other end of them is connected between the other end of the crystal resonator 12 and the other end of the first impedance adjusting circuit 17. The resistance 224 and the inductor 225 are connected to the condenser 222 in parallel. A description of the second negative resistance generating circuit 23, the condensers 231, 232, 233, the resistance 234 and the inductor 235 is omitted, since its configuration is the same as the configuration of the first negative resistance generating circuit 22.

Figure 6:
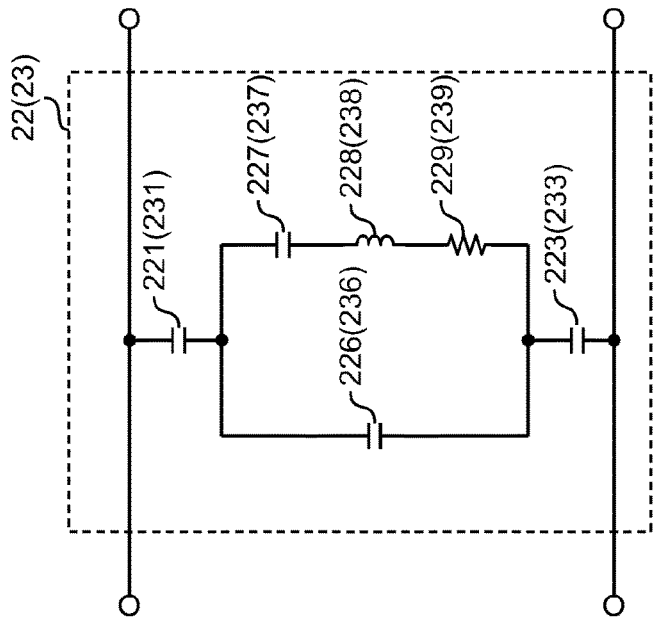
FIG. 6 shows other example of the circuit configuration of the first negative resistance generating circuit and the second negative resistance generating circuit according to the third exemplary embodiment.

It should be noted that the first negative resistance circuit 22 and the second negative resistance generating circuit 23 may have a circuit configuration different from the circuit configuration shown in FIG. 5. FIG. 6 shows other example of the circuit configuration of the first negative resistance generating circuit 22 and the second negative resistance generating circuit 23 according to the third exemplary embodiment. In an example shown in FIG. 6, the first negative resistance generating circuit 22 includes the condenser 221, the condenser 223, a condenser 226, a condenser 227, an inductor 228, and a resistance 229. The condenser 227, the inductor 228, and the resistance 229 are connected in series. The condenser 226 and the condenser 227, the inductor 228, and the resistance 229 that are connected in series foam a parallel circuit. One end of this parallel circuit is connected to the condenser 221 and the other end is connected to the condenser 223. Further, the condenser 221 is connected between one end of the crystal resonator 12 and one end of the first impedance adjusting circuit 17, and the condenser 223 is connected between the other end of the crystal resonator 12 and the other end of the first impedance adjusting circuit 17.

Since the first negative resistance generating circuit 22 includes the inductor 225 or the inductor 228 as shown in FIG. 5 and FIG. 6, the isolation of each oscillating circuit can be further improved. Thus, the crystal oscillator 1 can stably output the first oscillation signal corresponding to the C-mode and the second oscillation signal corresponding to the B-mode even if the crystal resonator 12 is an SC-cut crystal resonator. A description of the second negative resistance generating circuit 23, the condenser 231, 233, 236, 237, the inductor 238, and the resistance 239 is omitted, since its configuration is the same as the configuration of the first negative resistance generating circuit 22.

Figure 7:
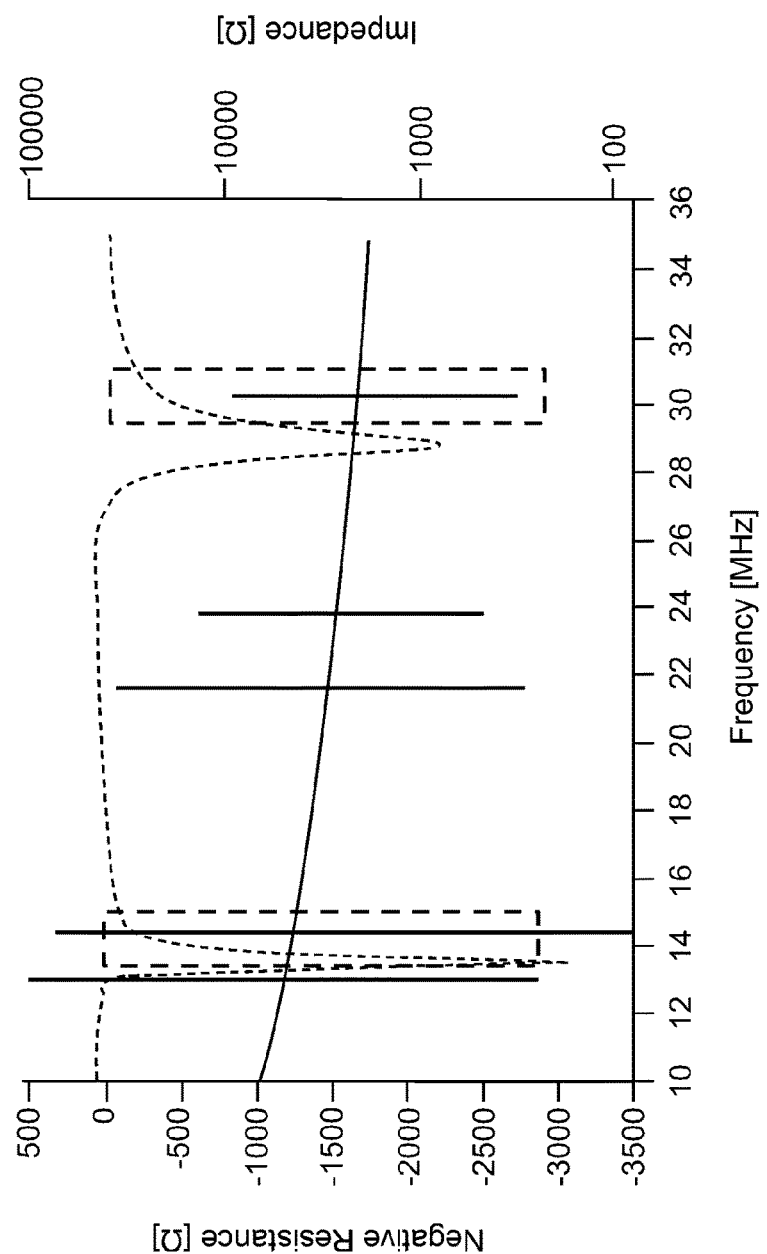
FIG. 7 shows the negative resistance characteristics of a first oscillating system and a second oscillating system and the impedance characteristics of a crystal resonator according to the third exemplary embodiment.

FIG. 7 shows the negative resistance characteristics of the first oscillating system and the second oscillating system, and the impedance characteristics of the crystal resonator 12 according to the third exemplary embodiment. In FIG. 7, the characteristics shown with a solid line is the characteristics of a combined impedance of a circuit side seen from the crystal resonator 12, and the characteristics shown with a dashed line is the negative resistance characteristics of the circuit side seen from the crystal resonator 12. Here, the first frequency of the first oscillation signal outputted in the first oscillating system is a frequency in a range surrounded by a dashed line around 30 MHz, and the second frequency of the second oscillation signal outputted in the second oscillating system is a frequency in a range surrounded by a dashed line around 14 MHz.

As shown in FIG. 7, it can be seen that an oscillation condition is satisfied because the negative resistance is a minus value and further, the crystal resonator 12 becomes high impedance at around 30 MHz. Further, it can be seen that the negative resistance does not almost exist at frequencies out of the predetermined range with respect to the first frequency.

Furthermore, it can be seen that the oscillation condition is satisfied because the negative resistance is a minus value and further, the crystal resonator 12 becomes high impedance at around 14 MHz. Moreover, it can be seen that the negative resistance does not almost exist at frequencies out of the predetermined range with respect to the second frequency.

Effect of the Third Exemplary Embodiment

As described above, the crystal oscillator 1 according to the third exemplary embodiment generates the negative resistance at an oscillation frequency of each oscillating system and can prevent the negative resistance from existing at frequencies out of the predetermined range with respect to the oscillation frequency by being provided with the first negative resistance generating circuit 22 and the second negative resistance generating circuit 23. Hence, an oscillation signal can be outputted in each oscillating system more stably.

The Fourth Exemplary Embodiment

[Providing a Filter Circuit]

Next, the fourth exemplary embodiment is described. The crystal oscillator 1 of the fourth exemplary embodiment is different from the crystal oscillator 1 of the first exemplary embodiment in a point that each oscillating system is provided with a filter circuit that cuts off the oscillation signal outputted from other oscillating system, and is the same as the crystal oscillator 1 of the first exemplary embodiment with respect to the other points.

Figure 8:
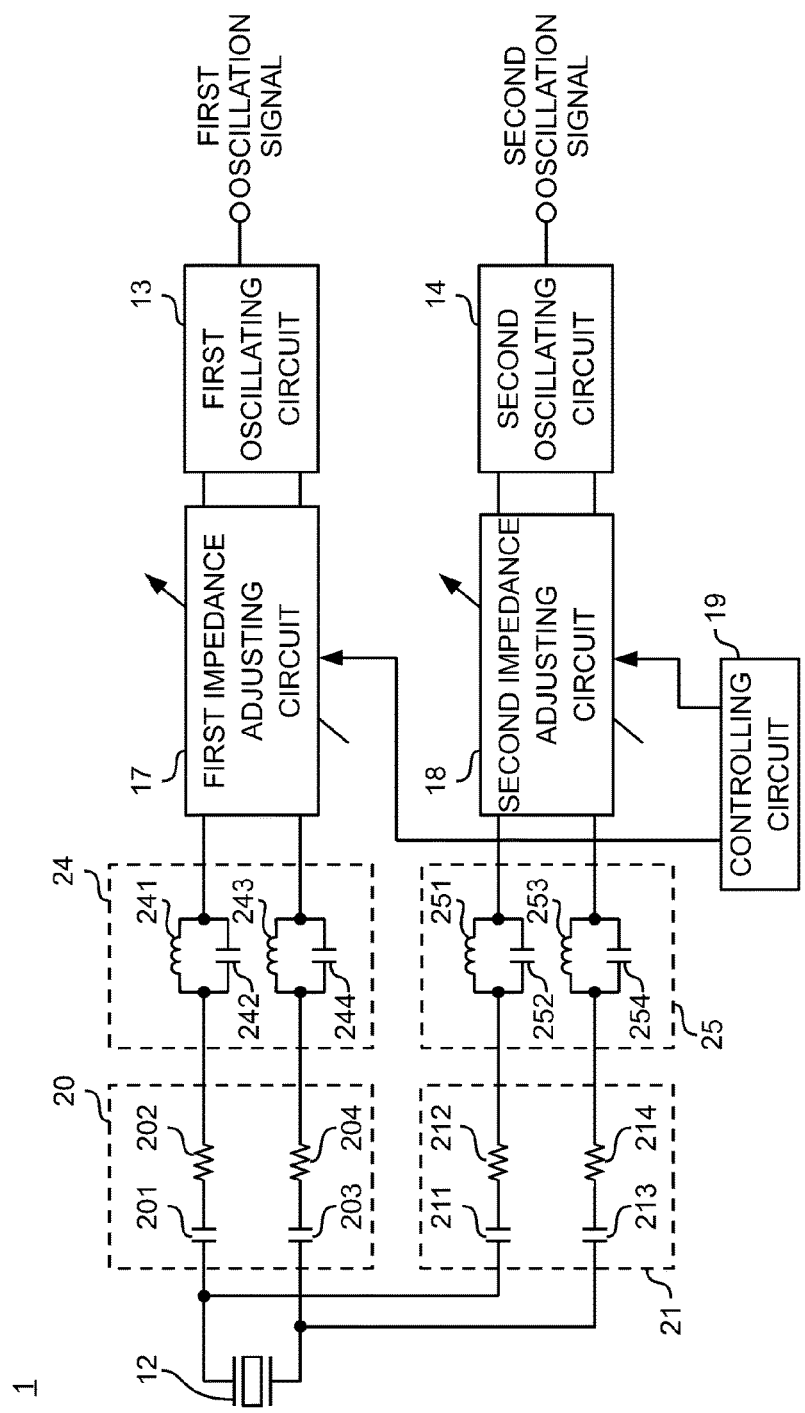
FIG. 8 shows an inner circuit configuration of a crystal oscillator according to the fourth exemplary embodiment.

FIG. 8 shows an inner circuit configuration of the crystal oscillator 1 according to the fourth exemplary embodiment. In the fourth exemplary embodiment, the crystal oscillator 1 further includes a first filter circuit 24 and a second filter circuit 25. It should be noted that the crystal oscillator 1 may be provided with any of the first filter circuit 24 and the second filter circuit 25.

Furthermore, the crystal oscillator 1 may have the first oscillating circuit 13, the second oscillating circuit 14, the first impedance adjusting circuit 17, the second impedance adjusting circuit 18, and the controlling circuit 19 in an integrated circuit as the second exemplary embodiment does. Moreover, the crystal oscillator 1 may have the first filter circuit 24 and the second filter circuit 25 in the integrated circuit.

The first filter circuit 24 is provided between the crystal resonator 12 and the first oscillating circuit 13 and cuts off the second oscillation signal of the second frequency. Specifically, the first filter circuit 24 includes an inductor 241, a condenser 242, an inductor 243, and a condenser 244. The inductor 241 and the condenser 242 are provided between one end of the crystal resonator 12 and one end of the impedance adjusting circuit 17, and these inductor 241 and condenser 242 are connected in parallel. The inductor 243 and the condenser 244 are provided between the other end of the crystal resonator 12 and the other end of the impedance adjusting circuit 17, and these inductor 243 and condenser 244 are connected in parallel. The first filter circuit 24, of which resonance frequency is the second frequency, is a filter circuit whose impedance is high at the second frequency.

The second filter circuit 25 is provided between the crystal resonator 12 and the second oscillating circuit 14 and cuts off the first oscillation signal of the first frequency. Specifically, the second filter circuit 25 includes an inductor 251, a condenser 252, an inductor 253, and a condenser 254. The inductor 251 and the condenser 252 are provided between one end of the crystal resonator 12 and one end of the second impedance adjusting circuit 18, and these inductor 251 and condenser 252 are connected in parallel. The inductor 253 and the condenser 254 are provided between the other end of the crystal resonator 12 and the other end of the second impedance adjusting circuit 18, and these inductor 253 and condenser 254 are connected in parallel. The second filter circuit 25, of which resonance frequency is the first frequency, is a filter circuit whose impedance at the first frequency is high.

Figure 9:
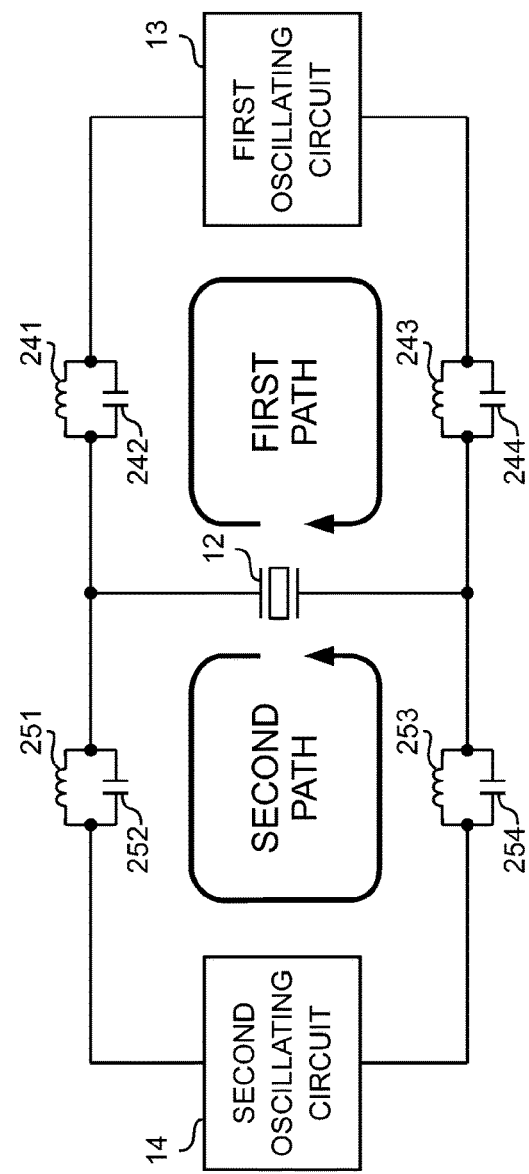
FIG. 9 shows signal paths in a crystal oscillator.
Figure 10:
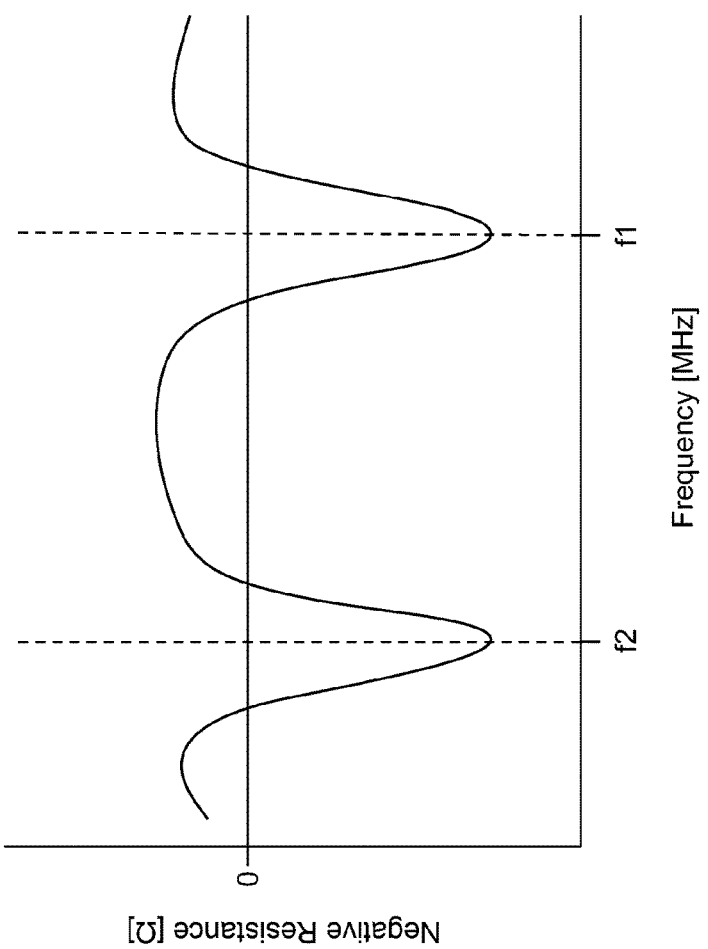
FIG. 10 shows the frequency characteristics of a circuit impedance of the crystal oscillator according to the fourth exemplary embodiment.

FIG. 9 shows signal paths in the crystal oscillator 1. FIG. 10 shows the frequency characteristics of a circuit impedance of the crystal oscillator 1. It should be noted that the first impedance adjusting circuit 17, the second impedance adjusting circuit 18, the first isolation adjusting circuit 20, and the second isolation adjusting circuit 21 are omitted in FIG. 9.

As shown in FIG. 9, crystal oscillator 1 has a first path and a second path as a signal path seen from the crystal resonator 12 since the first oscillating circuit 13 and the second oscillating circuit 14 are connected to one crystal resonator 12.

For example, since the impedance of the first filter circuit 24 at the second frequency 12 is high, the second oscillation signal does not flow through the first path when the second oscillation signal of the second frequency f2 is outputted from the second oscillating circuit 14. Thus, the second path is dominant among signal paths in the crystal oscillator 1. Accordingly, the first oscillating circuit 13 can be prevented from oscillating at the second frequency f2 and the stability of oscillation in the first oscillating circuit 13 can be improved by providing the first filter circuit 24 on the side of the first oscillating circuit 13.

Further, since the impedance of the second filter circuit 25 at the first frequency f1 is high, the first oscillation signal does not flow through the second path when first oscillation signal of the first frequency f1 is outputted from the first oscillating circuit 13. Hence, the first path is dominant among signal paths in the crystal oscillator 1. Accordingly, the second oscillating circuit 14 can be prevented from oscillating at the first frequency f1 and the stability of oscillation in the second oscillating circuit 14 can be improved by providing the second filter circuit 25 at the side of the second oscillating circuit 14.

It should be noted that, in the present exemplary embodiment, the first filter circuit 24 includes the inductor 241, the condenser 242, the inductor 243, and the condenser 244, but it is not necessarily so limited. The first filter circuit 24 may include either the parallel circuit that consists of the inductor 241 and the condenser 242 or the parallel circuit that consists of the inductor 243 and the condenser 244.

Moreover, in the present exemplary embodiment, the second filter circuit 25 includes the inductor 251, the condenser 252, the inductor 253, and the condenser 254, but it is not necessarily so limited. The second filter circuit 25 may include any of the parallel circuit that consists of the inductor 251 and the condenser 252 and the parallel circuit that consists of the inductor 253 and the condenser 254.

Further, the characteristics of the first filter circuit 24 and the second filter circuit 25 may be adjusted by using the controlling circuit. For example, a condenser array that consists of a plurality of condensers instead each of the condenser 242, the condenser 244, the condenser 252, and the condenser 254 is provided, and the capacitance value of the first filter circuit 24 and the second filter circuit 25 may be adjusted by controlling these condenser arrays by the controlling circuit. In this manner, a Q-value of the first filter circuit 24 and the second filter circuit 25 can be adjusted.

Effect of the Fourth Exemplary Embodiment

As mentioned above, the crystal oscillator 1 according to the fourth exemplary embodiment prevents the oscillation signal to flow to other oscillating system when the oscillation signal is outputted from each oscillating system by providing the first filter circuit 24 and the second filter circuit 25 and can output the oscillation signal in each oscillating system more stably.

The Fifth Exemplary Embodiment

Figure 11:
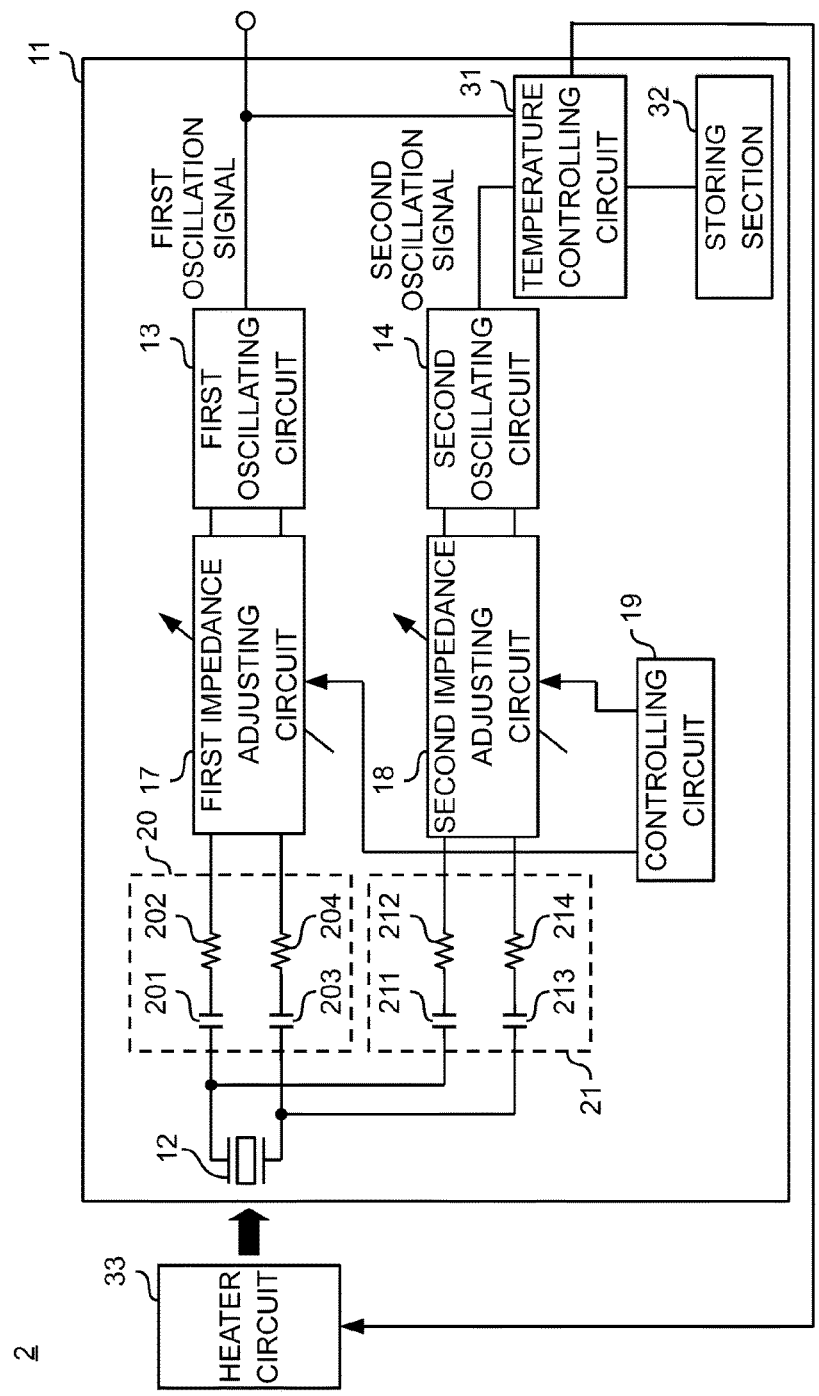
FIG. 11 shows an inner circuit configuration diagram of a crystal oscillator according to the fifth exemplary embodiment.
Figures 12, 13:
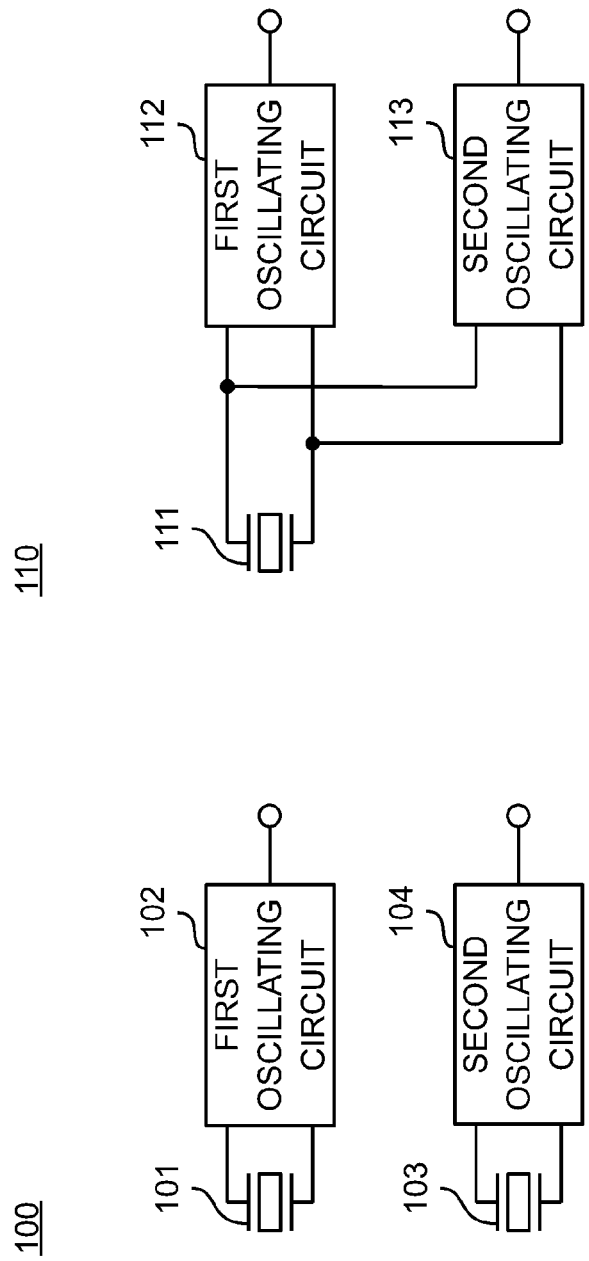
FIG. 12 shows a configuration of a conventional crystal oscillator that outputs a signal of two frequencies.
FIG. 13 shows a configuration of a crystal oscillator that simultaneously oscillates a crystal resonator at different frequencies at the same time.

FIG. 11 shows an inner circuit configuration diagram of the crystal oscillator 2 according to the fifth exemplary embodiment. The crystal oscillator 2 includes a thermostatic oven 11 that accommodates a circuit of the crystal resonator 1 according to any of the first to fourth exemplary embodiments. In the crystal oscillator 2 shown in FIG. 11, the crystal oscillator 1 of the first exemplary embodiment, a temperature controlling circuit 31, and a storing section 32 are accommodated, and a heater circuit 33 that heats the thermostatic oven 11 is provided outside of the thermostatic oven 11. The crystal oscillator 2 is different from the crystal oscillator 1 according to the first to fourth exemplary embodiments in a point that it conducts temperature control on the basis of the difference between the first frequency of the first oscillation signal outputted from the first oscillating circuit 13 and the second frequency of the second oscillation signal outputted from the second oscillating circuit 14.

The temperature controlling circuit 31 controls the temperature of the thermostatic oven 11 by controlling the heating amount of the heater circuit 33. Specifically, the temperature controlling circuit 31 is connected to the first oscillating circuit 13 and the second oscillating circuit 14, and specifies the difference between the first frequency and the second frequency by detecting the first frequency and the second frequency. The temperature controlling circuit 31 heats the thermostatic oven 11 by controlling the heat amount of the heater circuit 33 on the basis of the specified difference of the frequencies, and controls the temperature around the crystal resonator 12 in the thermostatic oven 11.

More specifically, the temperature controlling circuit 31 compares the measured value of the difference between the first frequency and the second frequency and the desired value of the difference between the first frequency and the second frequency stored in the storing section 32 that contains a memory such as EEPROM. The temperature controlling circuit 31 controls the heating amount of the heater circuit 33 such that the difference between the measured value and the desired value becomes smaller. In the example shown in FIG. 11, the first oscillation signal is inputted into the temperature controlling circuit 31 and is also outputted outside of the thermostatic oven 11, and the second oscillation signal is inputted to the temperature controlling circuit 31 for being used in the temperature control. In this manner, the crystal oscillator 2 can improve the frequency temperature characteristics of the first oscillation signal by improving the precision of the first frequency of the first oscillation signal.

It should be noted that the crystal oscillator 2 may output the second oscillation signal outside of the thermostatic oven 11. Furthermore, in the above description, the temperature controlling circuit 31 and the storing section 32 are provided in the thermostatic oven 11 but the temperature controlling circuit 31 and the storing section 32 may be provided outside of the thermostatic oven 11. Moreover, the crystal oscillator 2 may not be provided with the thermostatic oven 11.

Effect of the Fifth Exemplary Embodiment

As described above, the temperature controlling circuit 31 in the crystal oscillator 2 according to the fifth exemplary embodiment controls the temperature around the crystal resonator 12 by controlling the heating amount of the heater circuit 33 on the basis of the difference between the first frequency of the first oscillation signal outputted from the first oscillating circuit 13 and the second frequency of the second oscillation signal outputted from the second oscillating circuit 14 and can adjust the first frequency and the second frequency to the desired frequency. Accordingly, the crystal oscillator 2 can reduce the mounting area and stably oscillate an output signal even if the peripheral temperature changes.

What is claimed is:

1. A crystal oscillator, comprising:
   a crystal resonator, which is an AT-cut crystal resonator;
   a first oscillating circuit that oscillates the crystal resonator at a first frequency;
   a first impedance adjusting circuit that adjusts an impedance of a first oscillating system including the crystal resonator and the first oscillating circuit;
   a second oscillating circuit that oscillates the crystal resonator at a second frequency that is different from the first frequency at the same time with the first oscillating circuit, the second frequency being an overtone frequency of the crystal resonator;
a second impedance adjusting circuit that adjusts an impedance of a second oscillating system including the crystal resonator and the second oscillating circuit; and
a controlling circuit that controls the first impedance adjusting circuit and the second impedance adjusting circuit, wherein
the first impedance adjusting circuit and the second impedance adjusting circuit include a resistance array that comprises a plurality of resistances, and
the controlling circuit adjusts a resistance value of at least any of the first impedance adjusting circuit and the second impedance adjusting circuit by controlling the resistance array.

2. The crystal oscillator according to claim 1, further comprising:
a negative resistance generating circuit that generates a negative resistance in the first oscillating system or in the second oscillating system at the first oscillating frequency or the second frequency between the crystal resonator and at least any of the first oscillating circuit and the second oscillating circuit.

3. The crystal oscillator according to claim 2, wherein the negative resistance generating circuit becomes high impedance at any of the first frequency and the second frequency.

4. The crystal oscillator according to claim 2, wherein the negative resistance generating circuit becomes almost short-circuit state at frequencies out of a predetermined range with respect to the first frequency and frequencies out of a predetermined range with respect to the second frequency.

5. The crystal oscillator according to claim 1, further comprising:
an isolation adjusting circuit for securing an isolation between oscillating circuits between the crystal resonator and at least any of the first oscillating circuit and the second oscillating circuit.

6. The crystal oscillator according to claim 1, wherein
the first impedance adjusting circuit and the second impedance adjusting circuit further include a condenser array that comprises a plurality of condensers, and
the controlling circuit adjusts a capacitance value of at least any of the first impedance adjusting circuit and the second impedance circuit by controlling the condenser array.

7. The crystal oscillator according to claim 1, wherein
the first impedance adjusting circuit and the second impedance adjusting circuit further include a variable capacitance diode, and
the controlling circuit adjusts frequency characteristics of at least any of the first impedance adjusting circuit and the second impedance adjusting circuit by controlling the variable capacitance diode.

8. The crystal oscillator according to claim 1, wherein
the first oscillating circuit, the second oscillating circuit, the first impedance adjusting circuit, the second impedance adjusting circuit, and the controlling circuit are provided in an integrated circuit.

9. The crystal oscillator according to claim 1, further comprising at least any of:
a first filter circuit that is provided between the crystal resonator and the first oscillating circuit and cuts off an oscillation signal at the second frequency; and a second filter circuit that is provided between the crystal resonator and the second oscillating circuit and cuts off an oscillation signal at the first frequency.

10. A crystal oscillator, comprising:
a crystal resonator;
a first oscillating circuit that oscillates the crystal resonator at a first frequency;
a first impedance adjusting circuit that adjusts an impedance of a first oscillating system including the crystal resonator and the first oscillating circuit;
a second oscillating circuit that oscillates the crystal resonator at a second frequency that is different from the first frequency;
a second impedance adjusting circuit that adjusts an impedance of a second oscillating system including the crystal resonator and the second oscillating circuit;
a controlling circuit that controls the first impedance adjusting circuit and the second impedance adjusting circuit; and
a temperature controlling circuit that detects the first frequency and the second frequency and controls a temperature around the crystal resonator on a basis of a difference between the first frequency and the second frequency.

11. A crystal oscillator comprising:
a crystal resonator, which is an SC-cut crystal resonator;
a first oscillating circuit that oscillates the crystal resonator at a first frequency, the first frequency being a frequency at the time when the crystal resonator is oscillated in a B-mode;
a first impedance adjusting circuit that adjusts an impedance of a first oscillating system including the crystal resonator and the first oscillating circuit;
a second oscillating circuit that oscillates the crystal resonator at a second frequency that is different from the first frequency at the same time with the first oscillating circuit, the second frequency being a frequency at the time when the crystal resonator is oscillated in a C-mode;
a second impedance adjusting circuit that adjusts an impedance of a second oscillating system including the crystal resonator and the second oscillating circuit; and
a controlling circuit that controls the first impedance adjusting circuit and the second impedance adjusting circuit, wherein
the first impedance adjusting circuit and the second impedance adjusting circuit include a resistance array that comprises a plurality of resistances, and
the controlling circuit adjusts a resistance value of at least any of the first impedance adjusting circuit and the second impedance adjusting circuit by controlling the resistance allay.

12. The crystal oscillator according to claim 11, further comprising:
a negative resistance generating circuit that generates a negative resistance in the first oscillating system or in the second oscillating system at the first oscillating frequency or the second frequency between the crystal resonator and at least any of the first oscillating circuit and the second oscillating circuit.

13. The crystal oscillator according to claim 12, wherein
the negative resistance generating circuit becomes high impedance at any of the first frequency and the second frequency.

14. The crystal oscillator according to claim 12, wherein
the negative resistance generating circuit becomes almost short-circuit state at frequencies out of a predetermined range with respect to the first frequency and frequencies out of a predetermined range with respect to the second frequency.

15. The crystal oscillator according to claim 11, further comprising:
an isolation adjusting circuit for securing an isolation between oscillating circuits between the crystal resonator and at least any of the first oscillating circuit and the second oscillating circuit.

16. The crystal oscillator according to claim 11, wherein the first impedance adjusting circuit and the second impedance adjusting circuit further include a condenser array that comprises a plurality of condensers, and
the controlling circuit adjusts a capacitance value of at least any of the first impedance adjusting circuit and the second impedance circuit by controlling the condenser array.

17. The crystal oscillator according to claim 11, wherein the first impedance adjusting circuit and the second impedance adjusting circuit further include a variable capacitance diode, and
the controlling circuit adjusts frequency characteristics of at least any of the first impedance adjusting circuit and the second impedance adjusting circuit by controlling the variable capacitance diode.

18. The crystal oscillator according to claim 11, wherein the first oscillating circuit, the second oscillating circuit, the first impedance adjusting circuit, the second impedance adjusting circuit, and the controlling circuit are provided in an integrated circuit.

* * * * *